(12) United States Patent
Cho et al.

(10) Patent No.: US 10,075,798 B2
(45) Date of Patent: Sep. 11, 2018

(54) METHOD FOR PROVIDING AUDIO AND ELECTRONIC DEVICE ADAPTED TO THE SAME

(71) Applicant: Samsung Electronics Co., Ltd., Gyeonggi-do (KR)

(72) Inventors: Sungjae Cho, Seoul (KR); Ohyong Kwon, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 271 days.

(21) Appl. No.: 14/595,745

(22) Filed: Jan. 13, 2015

(65) Prior Publication Data
US 2015/0200641 A1  Jul. 16, 2015

(30) Foreign Application Priority Data
Jan. 13, 2014 (KR) ........................ 10-2014-0003947

(51) Int. Cl.
*H04S 7/00* (2006.01)
*H03G 3/30* (2006.01)
*H04M 3/56* (2006.01)
*H04M 7/00* (2006.01)

(52) U.S. Cl.
CPC ............ *H04S 7/30* (2013.01); *H03G 3/3005* (2013.01); *H04M 3/56* (2013.01); *H04M 7/0012* (2013.01); *H04M 2201/50* (2013.01); *H04R 2420/01* (2013.01); *H04S 7/40* (2013.01); *H04S 2400/11* (2013.01); *H04S 2400/13* (2013.01); *H04S 2420/01* (2013.01)

(58) Field of Classification Search
CPC .......... H04S 7/30; H04S 7/40; H04S 2400/11; H04S 2400/13; H04S 2420/01; H04M 3/56; H03G 11/00; H04R 2420/01
USPC ........................................ 381/80, 81; 700/94
See application file for complete search history.

(56) References Cited

U.S. PATENT DOCUMENTS

| | | | |
|---|---|---|---|
| 7,928,311 B2 | 4/2011 | Trivl et al. | |
| 7,953,236 B2 | 5/2011 | Vronay | |
| 2007/0286426 A1* | 12/2007 | Xiang | H04M 1/6016 381/17 |
| 2011/0060435 A1 | 3/2011 | Lee et al. | |

* cited by examiner

*Primary Examiner* — David Ton
(74) *Attorney, Agent, or Firm* — The Farrell Law Firm, P.C.

(57) ABSTRACT

A method and an electronic device are provided for simultaneously outputting different audios with directionality. The method includes outputting a first audio, and when a request to output a second audio is detected, changing at least one attribute value of the first audio and the second audio and outputting the first audio and the second audio.

9 Claims, 12 Drawing Sheets

METHOD FOR PROVIDING AUDIO AND ELECTRONIC DEVICE ADAPTED TO THE SAME

PRIORITY

This application claims priority under 35 U.S.C. § 119(a) to Korean Patent Application, filed on Jan. 13, 2014 in the Korean Intellectual Property Office and assigned Serial No. 10-2014-0003947, the entire disclosure of which is incorporated herein by reference.

BACKGROUND

1. Field of Invention

The present invention relates generally to providing audio of an electronic device, and more particularly, to methods for simultaneously providing more than one audio of an electronic device and applications thereof.

2. Description of Related Art

With the development of mobile communication technology, electronic devices, such as mobile communication devices or smart phones, are equipped with a variety of functions. Electronic devices have been recently developed to provide multimedia functions, such as voice communication, photography, video/audio playback, alarming, messaging, etc. In particular, applications related to a variety of functions are installed in electronic devices and may output various sounds during their execution. However, conventional methods for providing audio providing methods can output only a single audio sound at a time from an electronic device.

SUMMARY

The present invention has been made to address at least the problems and disadvantages described above, and to provide at least the advantages described below.

Accordingly, an aspect of the present invention is to provide a method for outputting audio signals with differing attributes, simultaneously and with directionality.

In accordance with an aspect of the present invention, a method for providing audio in an electronic device is provided. The method includes outputting a first audio, and when a request to output a second audio is detected, changing at least one attribute value of the first audio and the second audio and outputting the first audio and the second audio.

In accordance with another aspect of the present invention, a method for providing audio in an electronic device is provided. The method includes outputting audios, displaying a window, on a screen of the electronic device, for each of the audios, determining the order of priority of windows, and changing an attribute value of an audio corresponding to a highest priority window.

In accordance with another aspect of the present invention, an electronic device is provided. The electronic device includes an input unit configured to receive user input, an audio processing unit configured to process audio, an audio outputting unit configured to output audio processed by the audio processing unit, and a processor configured to control the audio processing unit, in response to the user input, to perform at least one of increasing a volume of a first audio greater than a volume of a second audio or increasing the volume of the second audio greater than the volume of the first audio, processing the first audio and the second audio to be out of phase, applying a weight to a specific frequency of the first audio or the second audio, and clipping a level of sound pressure of the first audio or the second audio.

In accordance with another aspect of the present invention, an electronic device is provided. The electronic device includes an audio outputting unit configured to output audios, a display unit configured to display, on a screen of the electronic device, a window for each of the audios, an input unit configured to receive a user input, an audio processing unit, and a processor configured to control the audio processing unit, in response to the user input, determine the order of priority of windows, and change an attribute value of an audio corresponding to a highest priority window.

BRIEF DESCRIPTION OF THE DRAWINGS

The above and other aspects, features, and advantages of the present invention will become more apparent from the following detailed description taken in conjunction with the accompanying drawings, in which.

DETAILED DESCRIPTION OF EMBODIMENTS OF THE PRESENT INVENTION

Figure 1:
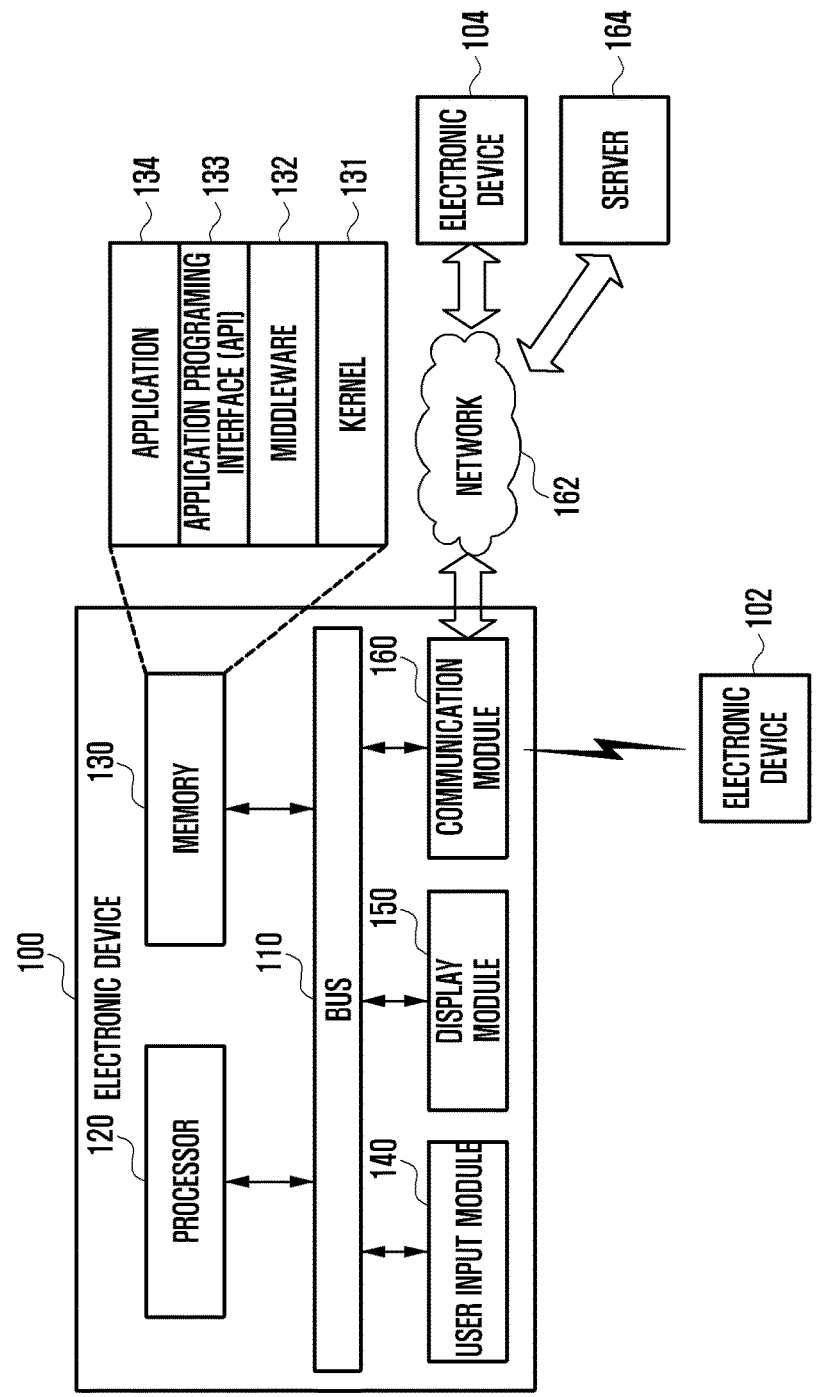
FIG. 1 illustrates a block diagram of an electronic device, according to an embodiment of the present invention.

The embodiments herein and the various features and advantageous details thereof will be described more fully with reference to the non-limiting embodiments that are illustrated in the accompanying drawings and detailed in the following description. It will be easily appreciated to those skilled in the art that various modifications, additions and substitutions are possible from the embodiments of the present invention provided herein, and the scope of the invention should not be limited to the embodiments herein. The embodiments of the present invention are provided as examples intended merely to facilitate an understanding of the present invention. In the drawings, the same or similar elements are denoted by the same reference numerals even though they are depicted in different drawings.

Expressions such as "include" and "may include" denote the presence of the disclosed functions, operations, and constituent elements and do not limit one or more additional functions, operations, and constituent elements. Terms such as "include" and "have" denote a certain characteristic, number, step, operation, constituent element, component or a combination thereof, but should not be construed to exclude the existence of or a possibility of addition of one or more other characteristics, numbers, steps, operations, constituent elements, components or combinations thereof.

Furthermore, the expression "and/or" includes any and all combinations of the associated listed words. For example, the expression "A and/or B" may include A, may include B, or may include both A and B.

Expressions including ordinal numbers, such as "first" and "second," etc., and/or the like, may modify various elements. However, such elements are not limited by the above expressions. For example, the above expressions do not limit the sequence and/or importance of the elements. The above expressions are used merely for the purpose of distinguishing one element from the other elements. For example, a first user device and a second user device indicate different user devices, although both of them, the first user device and the second user device, are user devices. Accordingly, a first element could be termed a second element, and similarly, a second element could be also termed a first element without departing from the scope of the present disclosure.

In the case where a component is referred to as being "connected" to or "accessed" by another component, it should be understood that not only may the component be directly connected to or accessed by the other component, but also there may exist another component between them the component and the other component. Meanwhile, in the case where a component is referred to as being "directly connected" to or "directly accessed" by another component, it should be understood that there is no component between the two components.

Singular forms are intended to include plural forms unless the context clearly indicates otherwise.

The terms or words described in the description and the claims should not be limited by a general or lexical meaning, but instead should be analyzed based on the meaning and concept through which the inventor defines and describes the invention. Descriptions of well-known components and processing techniques are omitted so as to not unnecessarily obscure the embodiments herein. The terms used herein are used merely to describe the various embodiments of the present invention provided herein, and are not intended to limit the scope of the present invention.

An electronic device, according to embodiments of the present invention is a device having a function for outputting audio for at least one application. For example, an electronic device, according to embodiments of the present invention, may be a smartphone, a tablet Personal Computer (PC), a mobile phone, a video phone, an e-book reader, a desktop PC, a laptop PC, a netbook computer, a Personal Digital Assistant (PDA), a Portable Multimedia Player (PMP), a digital audio player (e.g., MP3 player), a mobile medical device, a camera, or a wearable device. Examples of a wearable device are a head-mounted-device (HMD) (e.g., electronic eyeglasses), electronic clothing, an electronic bracelet, an electronic necklace, an electronic accessory, an electronic tattoo, a smart watch, etc.

In addition, an electronic device, according to embodiments of the present invention, may be smart home appliances. Examples of smart home appliances are a television (TV), a Digital Video Disk (DVD) player, an audio system, a refrigerator, an air-conditioner, a cleaning device, an oven, a microwave oven, a washing machine, an air cleaner, a set-top box, a TV box (e.g., Samsung HomeSync™, Apple TV™, or Google TV™), a game console, an electronic dictionary, an electronic key, a camcorder, an electronic album, or the like.

An electronic device, according to embodiments of the present invention, may also be various medical devices (e.g., Magnetic Resonance Angiography (MRA), Magnetic Resonance Imaging (MRI), Computed Tomography (CT), a scanning machine, an ultrasonic wave device, etc.), a navigation device, a Global Positioning System (GPS) receiver, an Event Data Recorder (EDR), a Flight Data Recorder (FDR), a vehicle infotainment device, electronic equipment for ships (e.g., navigation equipment, gyrocompass, etc.), avionics, a security device, an industrial or home robot, etc.

An electronic device, according to embodiments of the present invention, may further be furniture or a portion of a building/structure, an electronic board, an electronic signature receiving device, a projector, various measuring instruments (e.g., a water meter, an electric meter, a gas meter and a wave meter), etc., and a combination thereof. It should be obvious to those skilled in the art that the electronic device, according to embodiments of the present invention, is not limited to the aforementioned devices.

Hereinafter, electronic devices according the embodiments of the present invention are described in detail with reference to the accompanying drawings. In the description, the term a 'user' is referred to as a person or a device that uses an electronic device.

FIG. 1 is a block diagram of an electronic device, according to an embodiment of the present invention.

Referring to FIG. 1, the electronic device 100 includes a bus 110, a processor 120, a memory 130, a user input module 140, a display module 150, and a communication module 160.

The bus 110 is a communication circuit that connects the components of the electronic device 100 to each other and transfers data (e.g., control messages) between the components.

The processor 120 receives instructions from the components of the electronic device 100 (e.g., the memory 130, user input module 140, display module 150, communication module 160, etc.) via the bus 110, decodes the instructions, and performs corresponding operations or data processing, according to the decoded instructions.

The memory 130 stores instructions or data transferred from/created in the processor or the other components of the electronic device 100 (e.g., the user input module 140, display module 150, communication module 160, etc.). The memory 130 includes programming modules, e.g., a kernel 131, middleware 132, Application Programming Interface (API) 133, application module 134, etc. Each of the programming modules is software, firmware, hardware or a combination thereof.

The kernel 131 controls or manages system resources (e.g., the bus 110, processor 120, memory 130, etc.) used to execute operations or functions of the programming modules, e.g. the middleware 132, API 133, and application module 134. The kernel 131 may also provide an interface that accesses and controls/manages the components of the electronic device 100 via the middleware 132, API 133, and application module 134.

The middleware 132 makes it possible for the API 133 or application module 134 to perform communication and management of data with the kernel 121. The middleware 132 may also perform load balancing with respect to task requests by assigning the order of priority. For example, the middleware 132 receives task requests from two or more applications of the application module 134, and the middleware 132 assigns the order of priority to use the system resources (e.g., the bus 110, processor 120, memory 130, etc.) of the electronic device 100 to at least one application of the application module 134.

The API 133 is an interface that allows the application module 134 to control functions of the kernel 131 or middleware 132. For example, the API 133 may include at least one interface or function for file control, window control, character control, video process, etc.

The application module 134 may include applications related to Short Message Service (SMS)/Multimedia Messaging Service (MMS), email, a calendar, an alarm, health care (e.g., an application for measuring the blood sugar level, a workout application, etc.), environment information (e.g., atmospheric pressure, humidity, temperature, etc.), and so on. The application module 134 may also include an application related to exchanging information between the electronic device 100 and external electronic devices (e.g., an electronic device 104 as shown in FIG. 1). The information exchange-related application may be a notification relay application for transmitting specific information to an external electronic device, or a device management application for managing external electronic devices.

The notification relay application may include a function for transmitting notification information, created by the other applications of the electronic device 100 (e.g., SMS/MMS application, email application, health care application, environment information application, or the like), to external electronic device 104, as an example. In addition, the notification relay application may also receive notification information from external electronic device 104 and provide the information to the user. The device management application can manage: a function of the external electronic device 104 communicating with the electronic device 100 (e.g., turning on/off part or all of the external electronic device 104 or adjusting the brightness or resolution of the display of the external electronic device 104); applications operated in the external electronic device 104; or services from the external electronic device 104 (e.g., call service or messaging service). Examples of management by the device management application are installation, deletion, updating, or the like.

The application module 134 may include applications designated according to attributes of the external electronic device 104 (e.g., the type of electronic device). For example, if the external electronic device 104 is an MP3 player, the application module 134 may include an application related to music playback. If the external electronic device 104 is a mobile medical device, the application module 134 may include an application related to health care. In an embodiment of the present invention, the application module 134 may include at least one of the following: an application designated in the electronic device 100 and applications transmitted from external systems (e.g., server 164, external electronic device 102 or 104, etc.).

The user input module 140 receives instructions or data from the user and transfers the instructions to the processor 120 or the memory 130 through the bus 110. For example, the user input module 140 may receive data input to a touch screen, according to a user's touch, and transfer the data to the processor 120.

The display module 150 receives instructions or data from the processor 120, memory 130, and communication module 160, through the bus 110, and outputs the instructions on the screen. The display module 150 displays information (e.g., multimedia data, text, etc.) on a screen of the electronic device 100.

The communication module 160 controls communication between the electronic device 100 and an external system (e.g., the external electronic device 102 or 104 or server 164). For example, the communication module 160 may connect to a network 162 in a wireless or wired mode and communicate with the external systems. Wireless communication may include at least one of, for example, Wi-Fi, Bluetooth, Near Field Communication (NFC), Global Positioning System (GPS), or cellular communication (e.g., LTE, LTE-A, CDMA, WCDMA, UMTS, Wi-Bro, GSM, etc.). Wired communication may include at least one of, for example, Universal Serial Bus (USB), High Definition Multimedia Interface (HDMI), Recommended Standard 232 (RS-232), Plain Old Telephone Service (POTS), etc.

In an embodiment of the present invention, the network 162 is a telecommunication network, e.g., a computer network, the Internet, the Internet of Things (IoT), a telephone network, etc. The protocol for communication (e.g., transport layer protocol, data link layer protocol, or physical layer protocol) between the electronic device 100 and external systems may be supported by at least one of the following: application module 134, API 133, middleware 132, kernel 131, and communication module 160.

Figure 2:
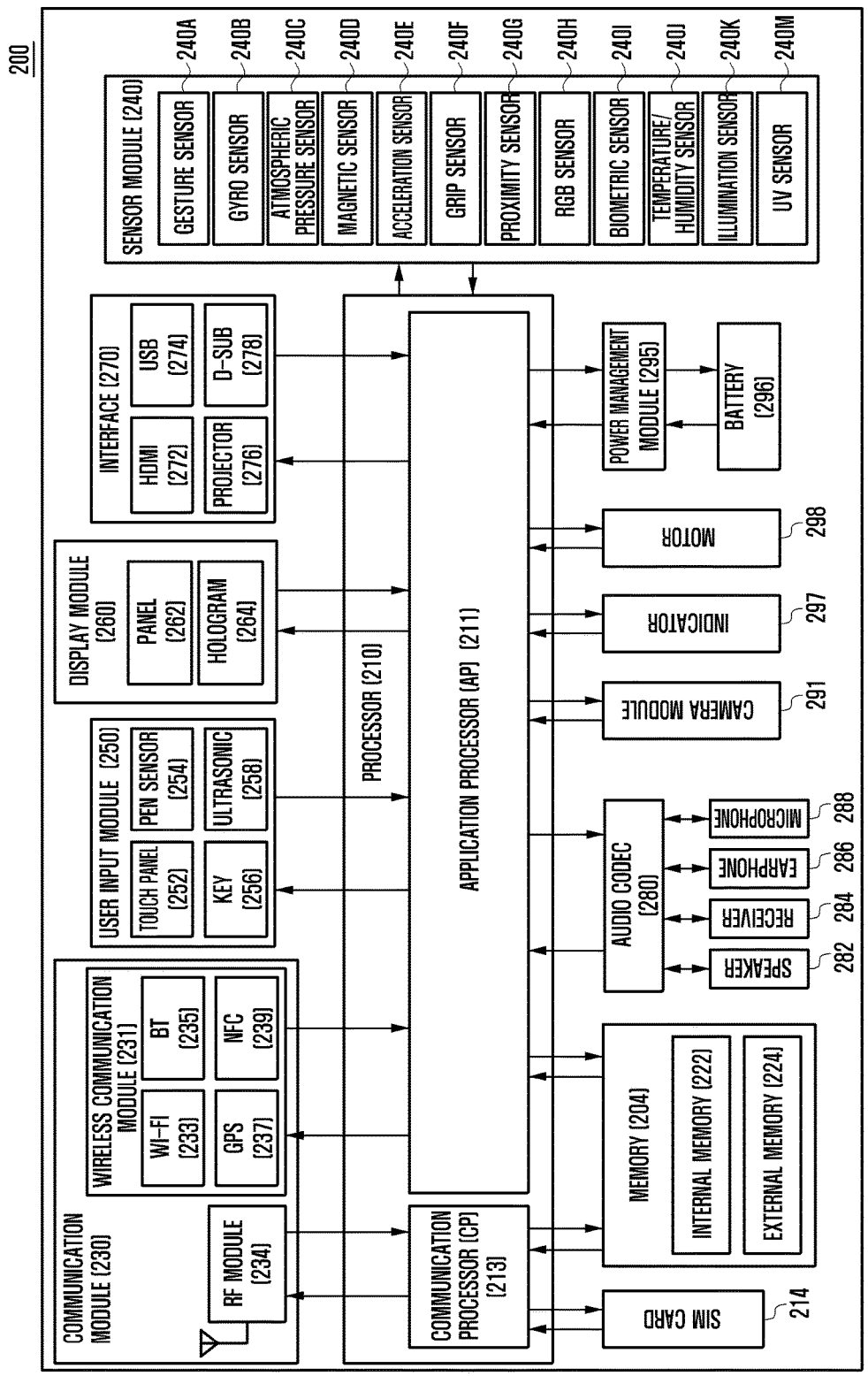
FIG. 2 illustrates a block diagram of a hardware device, according to an embodiment of the present invention.

FIG. 2 is a block diagram of a hardware device, according to an embodiment of the present invention.

Referring to FIG. 2, a hardware device 200 is provided. The hardware device 200, according to an embodiment of the present the invention may be the electronic device 100, as shown in FIG. 1. The hardware device 200 includes a processor 210, a Subscriber Identity Module (SIM) card 214, a memory 204, a communication module 230, a sensor module 240, a user input module 250, a display module 260, an interface 270, an audio codec 280, a camera module 291, a power management module 295, a battery 296, an indicator 297, and a motor 298.

The processor 210 includes one or more Application Processors (APs) 211 or one or more Communication Processors (CPs) 213. The processor 210 corresponds to the processor 120, shown in FIG. 1. Although the embodiment of the present invention shown in FIG. 2 is implemented in such a way that the APs 211 and CPs 213 are built in the processor 210, it should be understood that they may be each included in separate Integrated Circuits (ICs). In an embodiment of the present invention, the APs 211 and CPs 213 are included in one IC.

The AP 211 executes the operating system or applications, controls components related to the hardware or software, processes data, and performs corresponding operations. The AP 211 may be implemented with a System on a Chip (SoC). In an embodiment of the present invention, the AP 211 may further include a Graphic Processing Unit (GPU).

The CP 213 manages a data communication link between the electronic device 100, including the hardware device 200, and other electronic devices, which are connected to each other via a network, and performs communication protocol conversion. The CP 213 may be implemented with a SoC. In an embodiment of the present invention, the CP 213 controls part of the multimedia functions. For example, the CP 213 performs identification or authentication for mobile devices in a communication network by using their SIM card information. The CP 213 may also provide services, e.g., voice/video call, text messaging, packet data transferring, etc., to users.

The CP 213 controls data transmission/reception of the communication module 230. Although the embodiment of the present invention shown in FIG. 2 is implemented in such a way that the CP 213, the power management module 295, the memory 204, etc., are separated from the AP 211, the present invention can be modified in such a way that the AP 211 includes one or more of these components.

In an embodiment of the present invention, the AP 211 or the CP 213 receives instructions or data from at least one of a non-volatile memory or other component, such as the communication module 230, loads the received instructions or data to a volatile memory, and process the loaded instructions or data. The AP 211 or CP 213 stores data in a non-volatile memory which is transmitted from/created in at least one of the other components of the hardware device 200.

The SIM card 214 is a card including subscriber identification information. The SIM card 214 is fitted into a slot of the electronic device. The SIM card 214 includes unique identification information, e.g., Integrated Circuit Card Identifier (ICCID), or subscriber information, e.g., International Mobile Subscriber Identity (IMSI).

The memory 204 includes internal memory 222 and/or external memory 224. The memory 204 corresponds to the memory 130, shown in FIG. 1. Examples of the internal memory 222 include volatile memory (e.g., Dynamic Random Access Memory (DRAM), Static RAM (SRAM), Synchronous Dynamic RAM (SDRAM), etc.); non-volatile memory (e.g., One Time Programmable Read-Only Memory (OTPROM), Programmable ROM (PROM), Erasable and Programmable ROM (EPROM), Electrically Erasable and Programmable ROM (EEPROM), mask ROM, flash ROM, NAND flash memory, NOR flash memory; etc.

In an embodiment of the present invention, the internal memory 222 may be a Solid State Drive (SSD). The external memory 224 may further include a flash drive, a Compact Flash (CF) memory card, a Secure Digital (SD) card, a micro-Secure Digital (micro-SD) card, a mini-Secure Digital (mini-SD) card, an extreme Digital (xD) picture card, a memory stick, etc.

The communication module 230 controls data transmission/reception for communication between the electronic device 100 and the other electronic devices (e.g., external electronic device 102 or 104, server 164) that are connected to the electronic device 100 via the network 162. In an embodiment of the present invention, the communication module 230 includes a wireless communication module 231 or a Radio Frequency (RF) module 234. The communication module 230 corresponds to communication module 160 shown in FIG. 1. The wireless communication module 231 may include Wi-Fi 233, Bluetooth (BT) 235, GPS 237, or NFC 239 modules. The Wi-Fi 233, BT 235, GPS 237, and NFC 239 modules may include corresponding processors for processing data transmitted/received via corresponding modules. Although the embodiment of the present invention shown in FIG. 2 is implemented in such a way that the Wi-Fi 233, BT 235, GPS 237, and NFC 239 modules are separated from each other, the present invention can be modified in such a way that only some of the processors corresponding to the modules (e.g., two or more) are included in an IC or an IC package. For example, a Wi-Fi processor corresponding to the Wi-Fi 233 module, may be implemented with an SoC.

The wireless communication module 231 provides a wireless communication function using wireless frequencies. The wireless communication module 231 may also include a network interface (e.g., Local Area Network (LAN) card), a modem, etc. that connects the hardware device 200 to a network (e.g., Internet, LAN, Wide Area Network (WAN), telecommunication network, cellular network, satellite network, POTS, etc.).

The RF module 234 performs data transmission/reception using RF signals. The RF module 234 may include a transceiver, a Power Amplifier Module (PAM), a frequency filter, a Low Noise Amplifier (LNA), etc. The RF module 234 may also include parts for transmitting/receiving electromagnetic waves, e.g., conductors, wires, etc., via free space during wireless communication.

The sensor module 240 measures physical quantity or senses operation states of the electronic device 100 and converts the measured or sensed data to electrical signals. The sensor module 240 may include at least one of a gesture sensor 240A, a gyro sensor 240B, an atmospheric pressure sensor 240C, a magnetic sensor 240D, an acceleration sensor 240E, a grip sensor 240F, a proximity sensor 240G, Red-Green-Blue (RGB) sensor 240H, a biosensor 240I, a temperature/humidity sensor 240J, an illuminance sensor 240K, and an ultra-violet (UV) sensor 240M. The sensor module 240 may also include an e-nose sensor, an electromyography (EMG) sensor, an electroencephalogram (EEG) sensor, an electrocardiogram (ECG) sensor, a fingerprint sensor, etc. The sensor module 240 may also include a control circuit for controlling one or more sensors.

The user input module 250 includes a touch panel 252, a pen sensor 254 (e.g., for a digital pen), a key 256 and an ultrasonic input system 258. The user input module 250 corresponds to the input module 140, shown in FIG. 1.

The touch panel 252 is implemented with at least one of a capacitive sensor, a pressure sensor, an infrared sensor, and an ultrasonic sensor, to sense touches. The touch panel 252 may also include a control circuit. When the touch panel 252 is implemented with a capacitive sensor, it can sense mechanical/physical touches or proximity of an object. The touch panel 252 may also include a tactile layer. In that case, the touch panel 252 may provide tactile feedback to the user.

The pen sensor 254 is implemented in the same or similar fashion as receiving a user's touch input or by using a separate recognition sheet.

The key 256 includes mechanical buttons, optical keys or a key pad.

The ultrasonic input system 258 senses sounds via a microphone 288 of the hardware device 200, by using an input tool for generating ultrasonic signals and can check the sensed sounds. The ultrasonic input system 258 may sense signals in wireless mode. In an embodiment of the present invention, the hardware device 200 receives a user's input from an external system (e.g., a computer or server) via the communication module 230.

The display module 260 includes a panel 262 or a hologram unit 264. The display module 260 corresponds to the display module 150 shown in FIG. 1. The panel 262 may be implemented with a Liquid Crystal Display (LCD), Active Matrix Organic Light Emitting Diodes (AMOLEDs) display, or the like. The panel 262 may be implemented in a flexible, transparent, or wearable form. The panel 262 may form a single module with the touch panel 252. The hologram unit 264 shows a three-dimensional image in the air using interference of light. In an embodiment of the present invention, the display module 260 may also include a control circuit for controlling the panel 262 and/or the hologram unit 164.

The interface 270 includes a HDMI 272, a USB 274, a projector 276, a D-subminiature (D-sub) 278, etc. The interface 270 may also include a Mobile High-definition Link (MHL) interface, a SD card, a Multi-Media Card (MMC) interface, an Infrared Data Association (IrDA) interface, or the like.

The audio codec 280 performs conversion between audio and electrical signals. For example, the audio codec 280 processes audio output from/input to a speaker 282, a receiver 284, earphones 286, a microphone 288, etc.

The camera module 291 captures still images or moving images. In an embodiment of the present invention, the camera module 291 may include one or more image sensors (e.g., on the front side and/or the back side of electronic device 100), an Image Signal Processor (ISP), a flash (e.g., LED or a xenon lamp), or the like. The power management module 295 manages electric power of the hardware device 200. The power management module 295 may include a Power Management Integrated Circuit (PMIC), a charger integrated circuit, a battery gauge, etc.

The PMIC may be implemented in the form of an IC or an SoC. Electric charging power may be provided in a wired or wireless mode. A charger IC may charge a battery 296, preventing input over-voltage or input over-current from being input to the battery 296 from a charger. In an embodiment of the present invention, the charger IC may be implemented in at least one of a wired and a wireless charging type. Examples of the wireless charging type of charger IC are a magnetic resonance type, a magnetic induction type, an electromagnetic type, etc. If the charger IC is a wireless charging type, it may include an additional circuit for wireless charging, e.g., a coil loop unit, a resonance circuit, a rectifier, etc.

The battery gauge measures the level of the residual amount of voltage, the level of current, and temperature of the battery 296 during a charge. The battery 296 may receive electric power and supply it to the hardware device 200. The battery 296 may include a rechargeable battery or a solar battery.

The indicator 297 shows states of the hardware device 200 or of components of the hardware device 200 (e.g., AP 211), e.g., a booting state, a message state, a recharging state, etc.

The motor 298 converts an electrical signal into a mechanical vibration.

The hardware device 200 may also include a processor for supporting a mobile TV, e.g., a GPU. The processor may process media data that complies with standards of Digital Multimedia Broadcasting (DMB), Digital Video Broadcasting (DVB), media flow, etc.

Each of the elements/units of the hardware device 200, according to the embodiments of the present invention, may be implemented with one or more components, and be called different names according to types of electronic devices. The hardware device, according to the embodiments of the present invention, may include at least one element described above. The hardware device may be modified in such a way as to remove part of the elements or include new elements. In addition, the hardware device may also be modified in such a way that parts of the elements are integrated into one entity that performs their original functions.

The aforementioned modules, according to the embodiments of the present invention, may be implemented with at least one of an Application Specific Integrated Circuit (ASIC), Field-Programmable Gate Array (FPGAs), and a programmable-logic device that can perform functions that have been known or will be developed.

Figure 3:
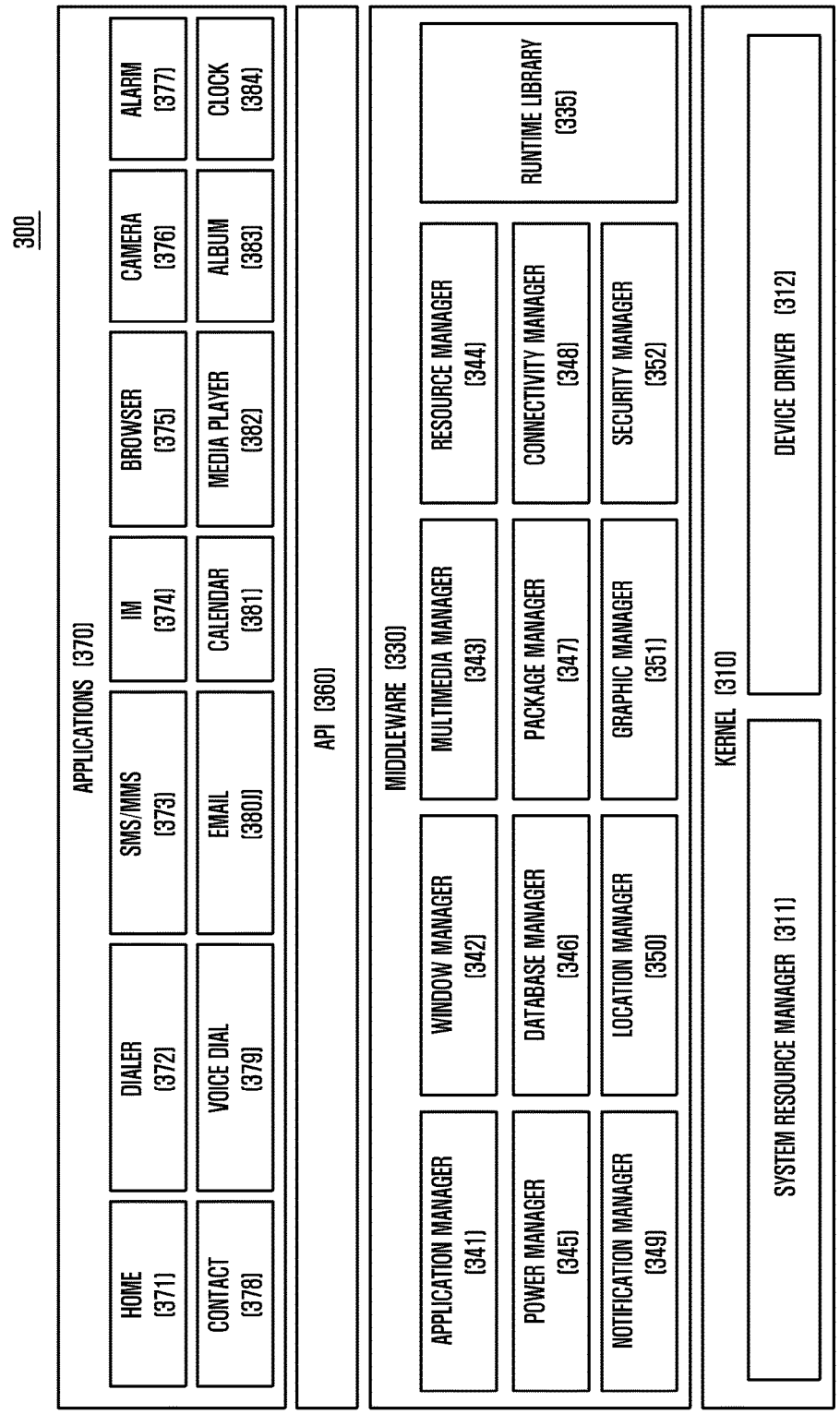
FIG. 3 illustrates a block diagram of a programming module, according to an embodiment of the present invention.

FIG. 3 is a block diagram of a programming module, according to an embodiment of the present invention.

Referring to FIG. 3, a programming module 300 is provided. The programming module 300 may be included (or stored) in the electronic device 100 (e.g., in the memory 130) shown in FIG. 1. Part of the programming module 300 may include software, firmware, hardware or a combination thereof. The programming module 300 may be implemented in hardware (e.g., the hardware device 200) and include an operating system (OS) for controlling resources related to an electronic device (e.g., the electronic device 100) or applications operated under the OS (e.g., an applications module 370). The OS may be Android, iOS, Windows, Symbian, Tizen, Bada, etc. The programming module 300 includes a kernel 310, a middleware 330, an API 360, and an application module 370.

The kernel 310 (corresponding to the kernel 131 shown in FIG. 1) includes a system resource manager 311 and a device driver 312. The system resource manager 311 may include a process management unit, a memory management unit and a file system management unit. The system resource manager 311 performs control, assignment or collection of system resources. The device driver 312 may include a display driver, a camera driver, a Bluetooth driver, a sharing memory driver, a USB driver, a keypad driver, a Wi-Fi driver, an audio driver, etc. In an embodiment of the present invention, the device driver 312 may also include an Inter-Process Communication (IPC) driver.

The middleware 330 may include a number of modules for providing functions that applications of the application module 370 need in common. The middleware 330 provides the functions via the API 360 so that the application module 370 can efficiently use limited system resources in the electronic device 100. The middleware 330 (corresponding to the middleware 132 shown in FIG. 1) includes at least one of a runtime library 335, a application manager 341, a window manager 342, a multimedia manager 343, a resource manager 344, a power manager 345, a database manager 346, a package manager 347, a connectivity manager 348, a notification manager 349, a location manger 350, a graphic manager 351, and a security manager 352.

The runtime library 335 includes library modules that a complier uses to add new functions via programming language while the applications of the application module 370 are executed. In an embodiment of the present invention, the runtime library 335 performs the inputting/outputting operation, memory management, arithmetic functions, etc.

The application manager 341 manages life cycles of one or more applications of the application module 370.

The window manager 342 manages GUI resources on the screen.

The multimedia manager 343 detects the formats for playing back media files. The multimedia manager 343 may encode or decode media files via a codec corresponding to the detected format.

The resource manager 344 manages resources such as memory, storage, source codes of one or more applications of the application module 370, etc.

With the operation of the Basic Input/Output System (BIOS), etc., the power manager 345 manages the battery or electric power supply and provides electric power information for operations.

The database manager 346 creates, searches for, or updates a database that will be used for or is used for at least one application of the application module 370.

The package manager 347 installs or updates applications distributed in the form of a package file.

The connectivity manager 348 manages wireless connectivity, such as Wi-Fi connectivity, Bluetooth connectivity, etc.

The notification manager 349 shows or notifies users of events such as a message arrival, a schedule, a proximity alarm, etc., in a way so as not to disturb them.

The location manger 350 manages location information regarding the electronic device 100.

The graphic manager 351 manages graphic effects provided to users or the GUI related thereto.

The security manager 352 provides security functions for system security or user authentication.

In an embodiment of the present invention, if the electronic device 100 has a phone function, the middleware 330 further includes a telephony manager for managing a voice/video call function.

The middleware 330 may be modified to include new middleware modules by combining the modules listed above, based on functions. The middleware 330 provides modules according to types of operating systems, in order to provide corresponding functions. The middleware 330 may be modified in such a way as to adaptively remove some of the modules or include new modules.

Part of the components listed in the embodiments of the present invention may be removed or replaced with other components that have similar functions as the parts but different names. The embodiments of the present invention may further include new components.

The API 360 is a set of API programming functions. The API 360 is configured according to types of operating systems (OSs). For example, Android or iOS may offer a set of API according to platforms. Tizen may offer two sets of APIs.

The application module 370 (e.g., corresponding to the application module 134) includes preloaded applications or a third-party applications.

At least part of the programming module 300 may be implemented by instructions stored in computer-readable storage media. If the instructions may be executed by one or more processors, e.g., processor 210, they can perform the functions respectively. An example of the computer-readable storage media may be a memory 204.

At least a part of the programming module 300 may be implemented by the processor 210. At least part of the programming module 300 may include modules, programs, routines, sets of instructions and/or processes, etc., in order to perform one or more functions.

It should be understood that components/units/modules of the programming module 300, according to the embodiments of the present invention, are called different names according to types of OSs. Modules or programming modules, according to the embodiment of the present invention, may include one or more components or include new components. The operations performed by the modules, programming modules, or the other components, according to the embodiments of the present invention, may be executed in serial, parallel, repetitive or heuristic fashion. Part of the operations can be executed in any other order, skipped, or executed with additional operations.

FIGS. 4A to 4D illustrate a method for outputting call and music audio with directionality, according to an embodiment of the present invention.

Figure 4A:
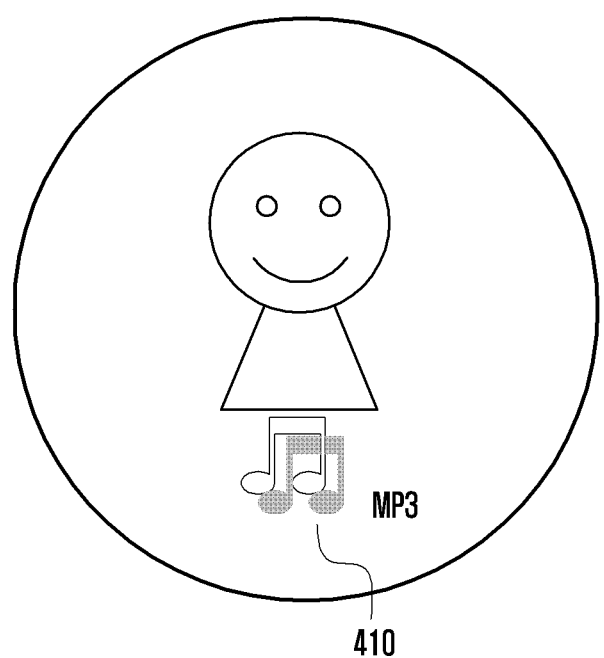
FIGS. 4A to 4D illustrate a method for outputting call and music audio, with directionality, according to an embodiment of the present invention.

Referring to FIG. 4A, processor 210 controls audio codec 280 to output a music sound 410 to an audio outputting unit (e.g., earphones 286).

Figure 4B:
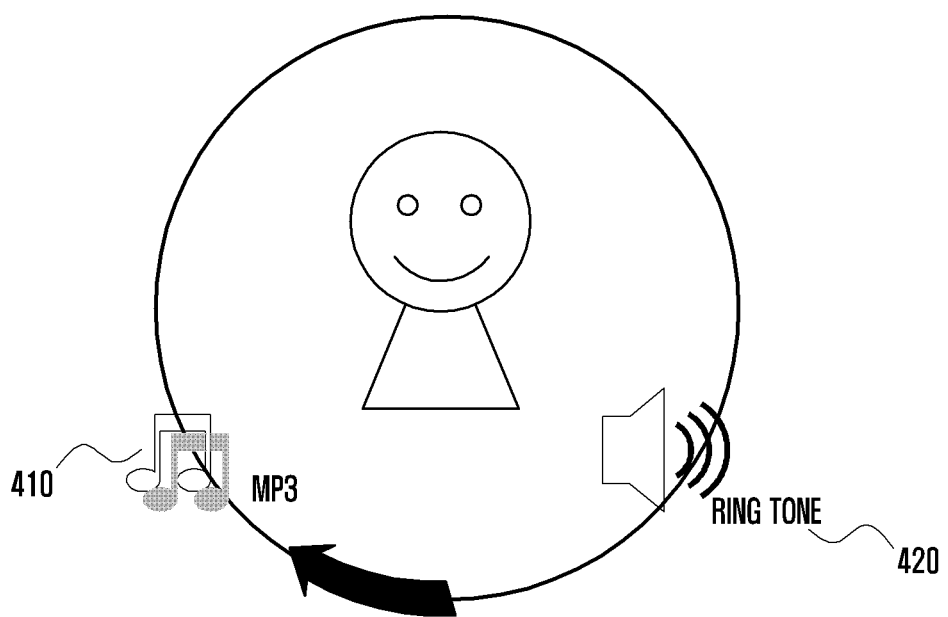

Referring to FIG. 4B, the processor 210 receives an incoming call signal via the communication module 230. While outputting the music sound 410, the processor 210 controls the audio codec 280 to output a ring tone 420 according to the incoming call signal. That is, the audio codec 280 simultaneously outputs a music sound 410 and a ring tone 420 by volume-mixing. The audio codec 280 can make the music sound 410 and ring tone 420 out of phase with one another and output them to the speaker 282.

Figure 4C:
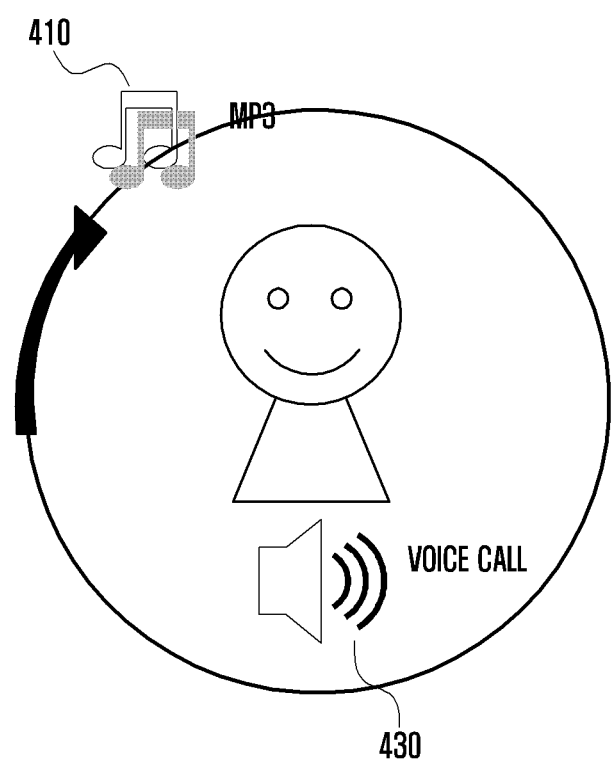

Referring to FIG. 4C, if the processor 210 receives a call acceptance event from the user input module 250, the processor 210 controls the communication module 230 to transmit the call acceptance message to an external system (e.g., a base station) in response to the call acceptance event. The processor 210 receives a call audio signal via the communication module 230. The processor 210 controls the audio codec 280 to output the music sound 410 and a call audio 430. The audio codec 280 makes the music sound 410 and call audio 430 out of phase with each other and mixes them. After that, the audio codec 280 outputs the mixed audios via the speaker 282. According to the control of the processor 210, the audio codec 280 processes the music sound 410 and call audio 430 so that the user can hear them with directionality (e.g., the call audio 430 sounds relatively closer than the music sound 410, or the music sound 410 sounds relatively farther away than the call audio 430). To achieve the directionality, the audio codec 280 can relatively increase the volume of the call audio 430 more than that of the music sound 410, or vice versa. Alternatively, the audio codec 280 may apply a weight to a specific frequency of the music sound 410 (e.g., by multiplying, adding, or subtracting a particular constant to a specific frequency of the music sound 410), so that the music sound 410 sounds farther away than the call audio 430. Similarly, the audio codec 280 may apply a weight to a specific frequency of the call audio 430, so that the call audio 430 sounds closer than the music sound 410. Alternatively, the audio codec 280 can apply a level of sound pressure to the music sound 410, so that the music sound 410 sounds farther away than the call audio 430. For example, if the range of pressure is −20 dB to 20 dB, the audio codec 280 may clip the output level of sound pressure of the music sound 410 to 20 dB and then output it to the earphones 286.

Figure 4D:
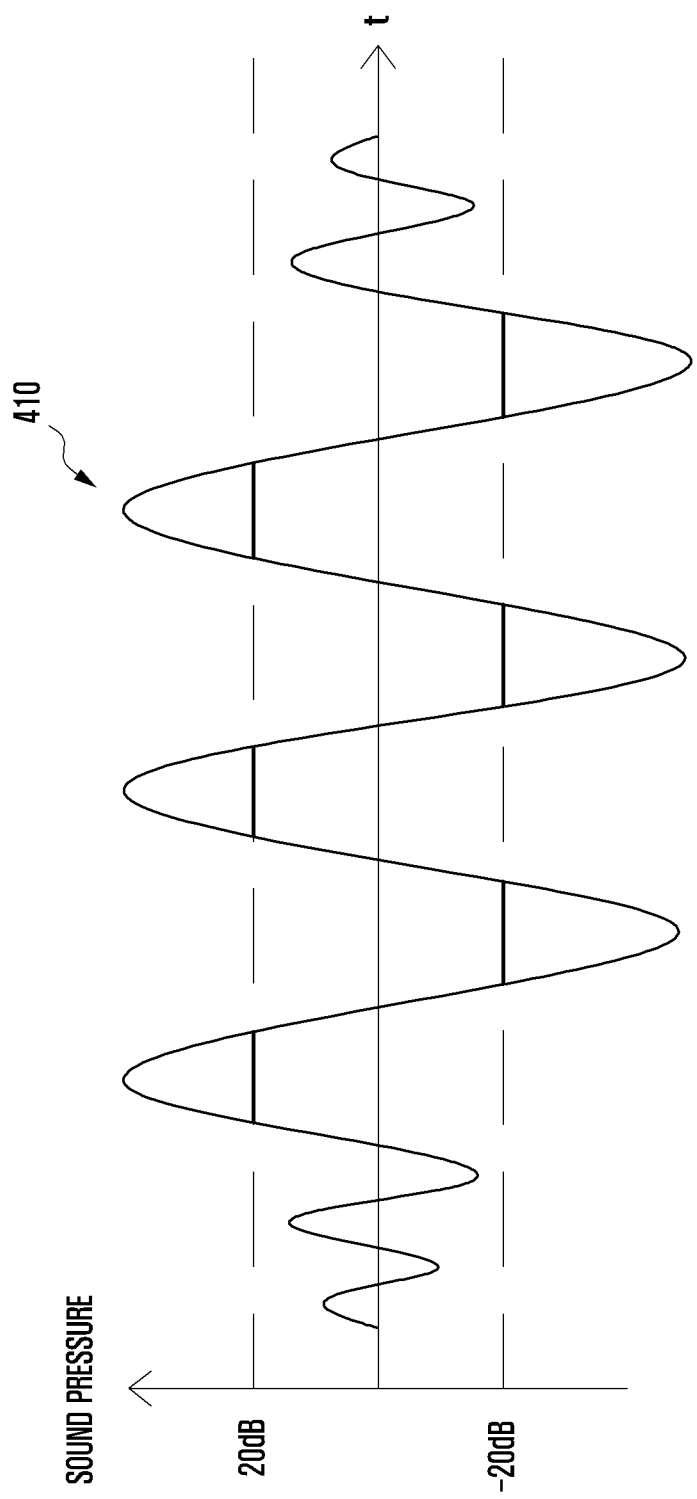

Referring to FIG. 4D, the clipping is a process to cut off the level of sound pressure of the music sound 410 over 20 dB, for example, and to output it.

Referring back to FIG. 4A, if the processor 210 receives a call end event via the user input module 250, the processor 210 controls the communication module 230 to transmit a call end message to an external system (e.g., a base station) according to the call end event. The processor 210 controls the audio codec 280 only to output the music sound 410. In addition, the audio codec 280 may return the attribute value of the music sound 410 to the previously set value (e.g., by removing the weight or the level of sound pressure or restoring the original level of volume).

Figure 5A:
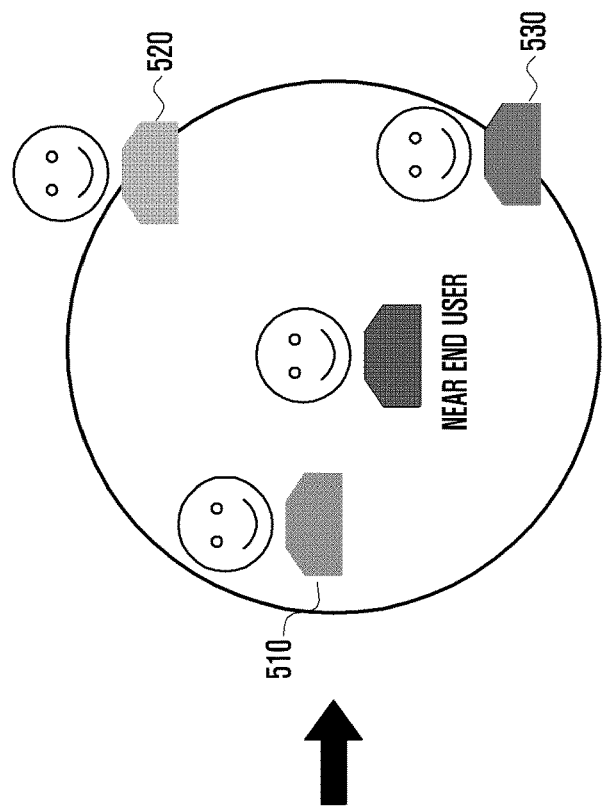
FIGS. 5A and 5B illustrate conceptual views a method for outputting call audio in a conference call, with directionality, according to an embodiment of the present invention.
Figure 5B:
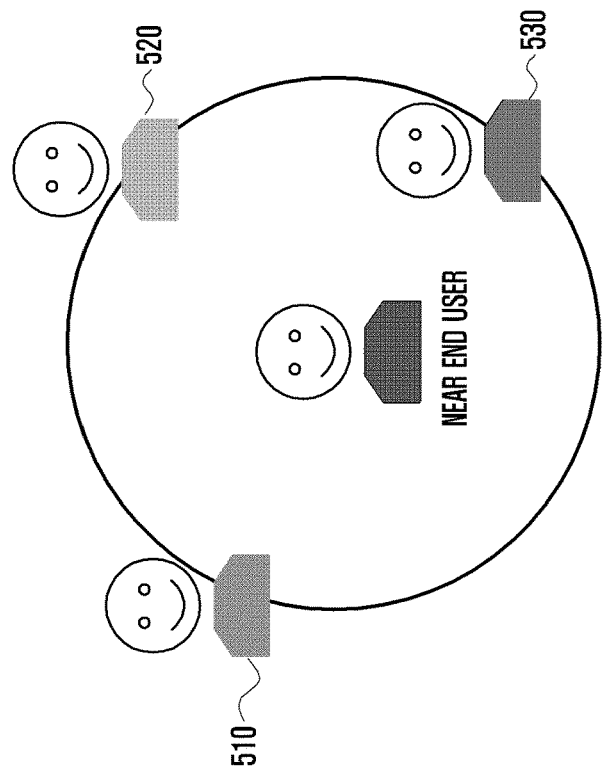

FIGS. 5A and 5B illustrate a method for outputting call audio in a conference call, with directionality, according to an embodiment of the present invention.

Referring to FIGS. 5A and 5B, the electronic device 100, according to the embodiment of the present invention, may provide a service that allows the user to make a conference call with a number of third party users.

Referring to FIG. 5A, the processor 210 controls the audio codec 280 to output call audios of a first far end user 510, a second far end user 520, and a third far end user 530 to an audio outputting unit (e.g., earphones 286). The audio codec 280 processes the audio of the calls to be out of phase with each other, mixes the audio, and outputs them to the speaker 282.

Referring to FIG. 5B, the processor 210 receives a location selection event via the user input module 250. The processor 210 processes the call audios 510, 520 and 530 so that the user can hear them with directionality. As described with reference to FIGS. 4A to 4D, the audio codec 280 can increase the volume of the call audio 510 more than those of the other call audios 520 and 530. In addition, the audio codec 280 may apply a weight to a specific frequency of the call audio 510. The audio codec 280 can also apply a level of sound pressure to the call audios 520 and 530.

FIGS. 6A to 6D illustrate a method for outputting call audio in a video call, with directionality, according to an embodiment of the present invention.

Referring to FIGS. 6A to 6D, the electronic device 100 may provide a service that allows the user to make a video call with a third party user. In this case, the electronic device 100 may receive call audio from the third party user, from server 164 via a network 162, process the call audio so that the user of the electronic device 100 can hear it with directionality, and output the call audio with directionality. The server 164 receives call video and call audio that are mixed or composited with each other from electronic device 104. The server 164 separates the call video and call audio from each other. The server 164 processes the call audio so that the user can hear it with directionality (e.g., by applying a weight to a specific frequency of the call audio, applying a level of sound pressure, etc.), mixes the processed call audio with the call video, and transmits it to the electronic device 100.

Figure 6A:
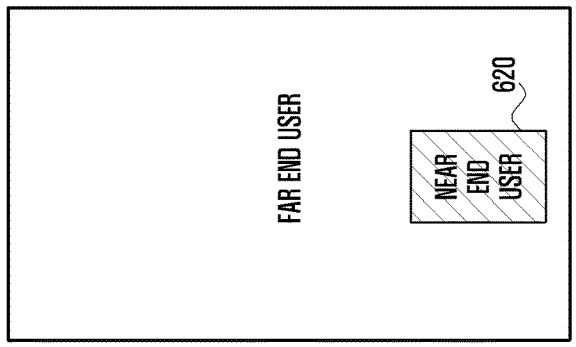
FIGS. 6A to 6D illustrate a method for outputting call audio in a video call, with directionality, according to an embodiment of the present invention.

Referring to FIG. 6A, the processor 210 controls the display module 150 to display an image of a far end user 610 (e.g., a user of the electronic device 102, 104, etc.) and an image of a near end user 620 (e.g., the user of the electronic device 100) on the screen of the electronic device 100. The display module 150 displays the images in Picture-In-Picture (PIP) mode, according to the control of the processor 210. For example, the display module 150 displays the far end user's image 610 on the full screen (or on the part of the full screen that is set as a call screen), and the near end user's image 620 on the near end user's image 610. The touch panel 252 senses a user's gesture (e.g., a first drag), creates a drag event signal, and transfers the signal to the processor 210. The processor 210 moves the near end user's image 620 to the bottom left on the screen in response to the first drag gesture. The processor 210 controls the communication module 230 to transmit a message for requesting direction change (that includes, e.g., first location information regarding the near end user's image 620 on the screen) to the server 164. In response to the direction change requesting message, the server 164 processes call audios so that the volume of a call audio output to a first channel (e.g., the left ear phone), hereinafter called a left call audio, can be greater than that of call audio output to a second channel (e.g., the right ear phone), hereinafter called a right call audio, and transmits the audio of both calls to the electronic device 100. Alternatively, the server 164 processes the left and right call audios to be out of phase (e.g., the left call audio lags behind the right call audio by a phase angle of 90° or the left call audio and the right call audio form sine and cosine waves, respectively) and transmits them to the electronic device 100. The electronic device 100 outputs the call audios processed in the server 164 to the earphones 286. Therefore, the user of the electronic device 100 can feel like he/she hears the far end user's voice speaking at his/her left.

Figure 6B:
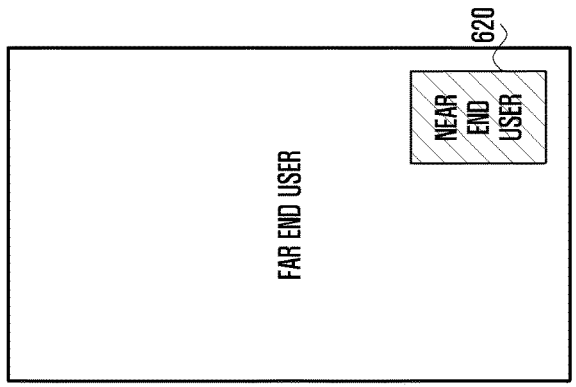

Referring to FIG. 6B, the processor 120 moves the near end user's image 620 to the top center on the screen in response to a second drag gesture. The processor 120 controls the communication module 230 to transmit a message for requesting direction change (that includes, e.g., second location information regarding the near end user's image 620 on the screen) to the server 164. In response to the direction change requesting message, the server 164 processes audios of the calls so that the volumes of the left call audio and right call audio are equal to each other, and transmits them to the electronic device 100. Alternatively, the server 164 processes the left call audio and right call audio to be out of phase (e.g., the left call audio leads the right call audio by a phase angle of 90° or the left call audio and right call audio form cosine and sine waves, respectively) and transmits them to the electronic device 100. Therefore, the user of the electronic device 100 can feel like he/she hears the far end user's voice speaking behind his/her back.

Figure 6C:
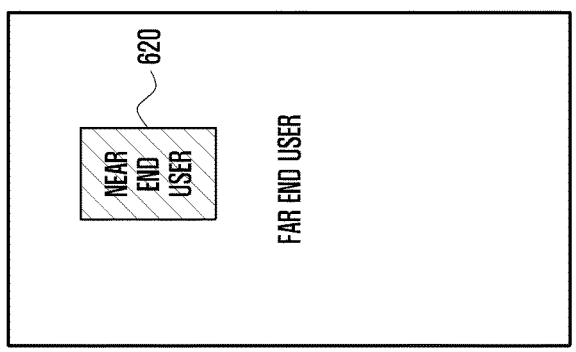

Referring to FIG. 6C, the processor 210 moves the near end user's image 620 to the bottom right on the screen in response to a third drag gesture. The processor 210 controls the communication module 230 to transmit a message for requesting direction change (that includes, e.g., third location information regarding the near end user's image 620 on the screen) to the server 164. In response to the direction change requesting message, the server 164 processes the audio of the calls so that the volume of a right call audio can be greater than that of a left call audio, and transmits both call audios to the electronic device 100. Alternatively, the server 164 processes the left call audio and right call audio to be out of phase (e.g., the left call audio lags behind the right call audio by a phase angle of 90° or the left call audio and right call audio form sine and cosine waves, respectively) and transmits the audio to the electronic device 100. Therefore, the user of the electronic device 100 can feel like he/she hears the far end user's voice speaking at his/her right.

Figure 6D:
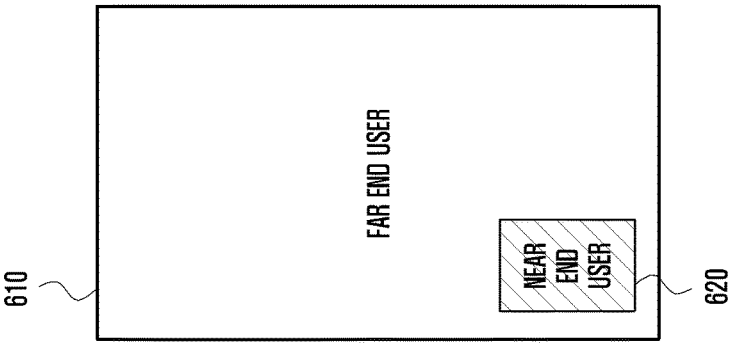

Referring to FIG. 6D, the processor 210 moves the near end user's image 620 to the bottom center on the screen in response to a fourth drag gesture. The processor 210 controls the communication module 230 to transmit a message for requesting direction change (that includes, e.g., fourth location information regarding the near end user's image 620 on the screen) to the server 164. In response to the direction change requesting message, the server 164 process audio of the calls so that the volumes of the left call audio and right call audio are equal to each other, and transmits the audio to the electronic device 100. Alternatively, the server 164 processes the left call audio and right call audio to be out of phase (e.g., the left call audio lags behind the right call audio by a phase angle of 90° or the left call audio and right call audio form sine and cosine waves respectively) and transmits the audio to the electronic device 100. Therefore, the user of the electronic device 100 can feel like he/she hears the far end user's voice speaking close to him/her.

Figure 7A:
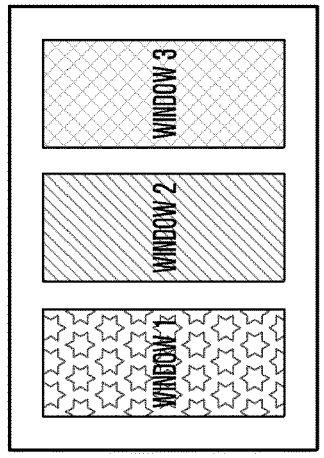
FIGS. 7A to 7C illustrate a method for outputting audio corresponding to two or more applications, with directionality, according to an embodiment of the present invention.
Figure 7A:
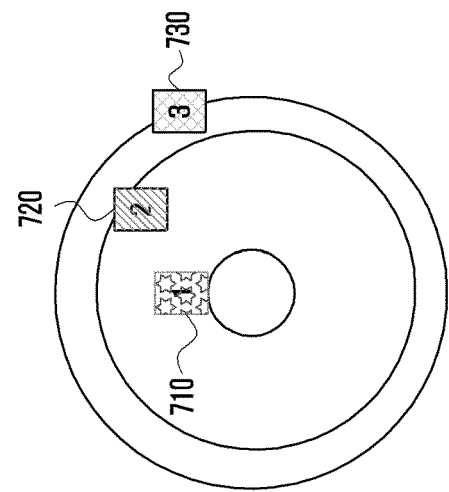
Figure 7B:
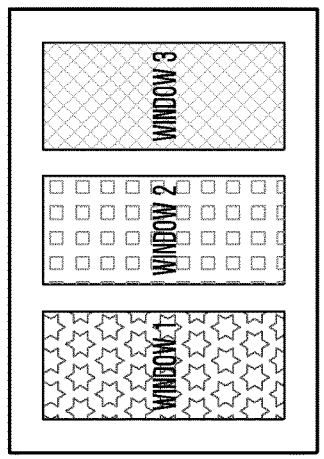
Figure 7B:
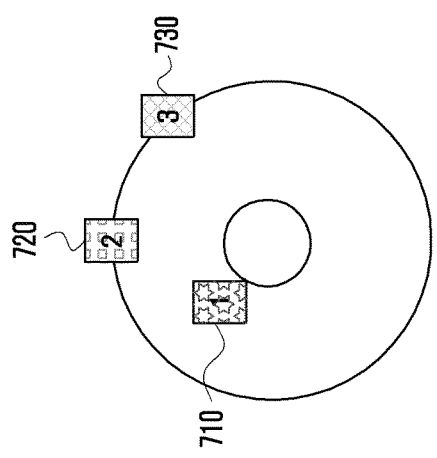
Figure 7C:
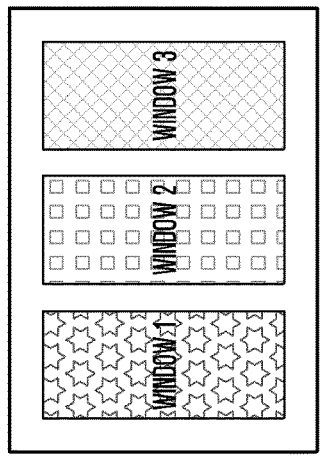
Figure 7C:
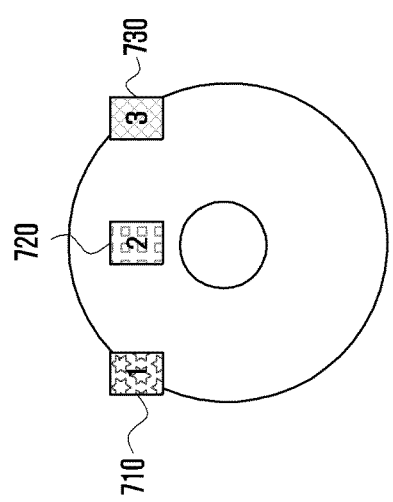

FIGS. 7A to 7C illustrate a method for outputting audio corresponding to two or more applications, with directionality, according to an embodiment of the present invention.

Referring to FIG. 7A, the processor 210 controls the display module 260 to display window 1 for a first application, window 2 for a second application, and window 3 for a third application. The processor 210 controls the audio codec 280 to output an audio 710 for the first application, an audio 720 for the second application, and an audio 730 for the third application to an audio outputting unit (e.g., earphones 286). In particular, according to the control of the processor 210, the audio codec 280 processes the audio so that the audio 710 sounds at the user's left, the audio 720 sounds at the user's near front, and the audio 730 sounds at the user's right. When window 2 is focused (e.g., the user selects window 2 so that its outline is thicker than the other windows' outline), the processor 210 ascertains that the audio 720 is more important than the other audio 710 and audio 730 (i.e., the audio 720 has a higher priority than the other audios 710 and 730). The processor 210 controls the audio codec 280 to process the audio such that the audio 720 sounds closer than the other audio 710 and audio 730.

Referring to FIG. 7B, when window 1 is focused, the processor 210 controls the audio codec 280 to process the audios such that the audio 710 sounds closer than the other audio 720 and audio 730.

Referring to FIG. 7C, the processor 210 controls the audio codec 280 to process the audio such that the audio 710 sounds at the nearest place and the audio 730 sounds at the farthest place.

Although the embodiments of the present invention are described based on their configuration including processor 210, display module 260, audio codec 280 and touch screen 252, it should be understood that the invention is not limited to the embodiments. For example, the embodiment of the present invention may be modified in such a way that the electronic device 100 performs the functions of the processor 210, display module 260 and touch panel 252, described above, and the electronic device 102 also performs the functions of the audio codec 280 and of an audio outputting unit (e.g., 5.1 channel speaker set), described above. In addition, the electronic devices 100 and 102 can communicate with each other (for example, via Bluetooth module 235) to transmit data for outputting audio with directionality.

Figure 8:
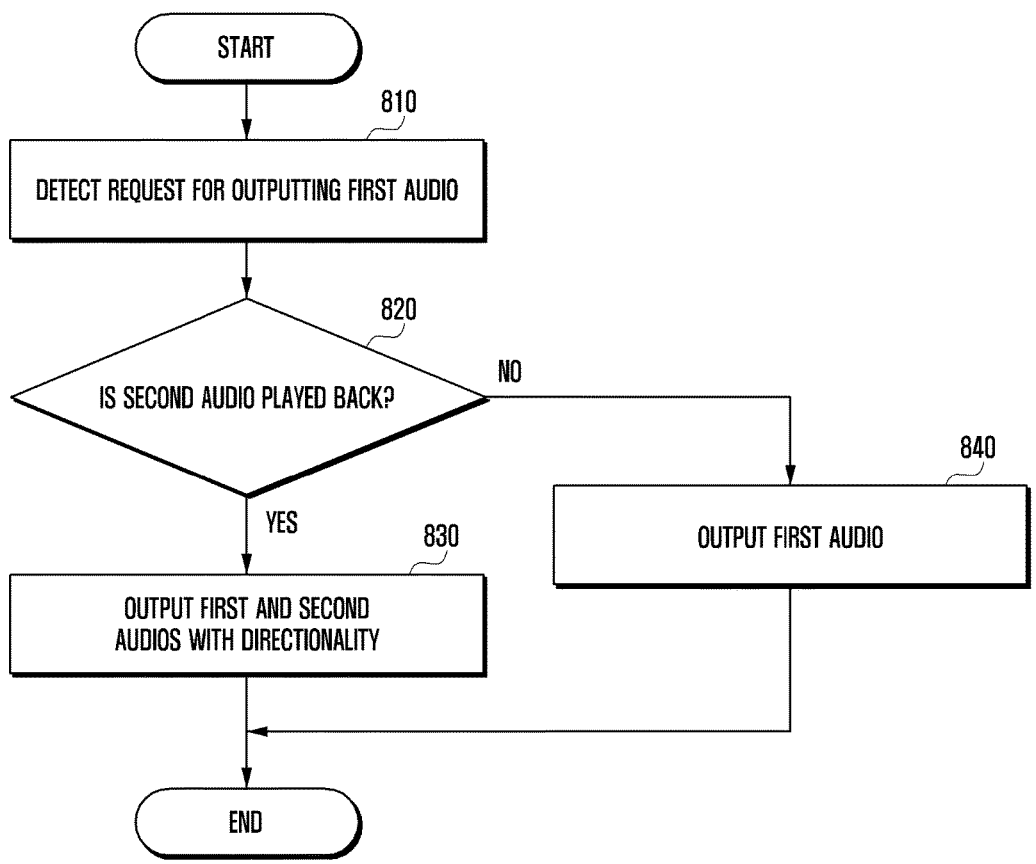
FIG. 8 is a flowchart of a method for providing audio, according to an embodiment of the present invention.

FIG. 8 is a flowchart of a method for providing audio, according to an embodiment of the present invention.

Referring to FIG. 8, an electronic device 100 detects a request for outputting (playing back) a first audio (e.g., a user's call acceptance event), at step 810. In response to the request for outputting the first audio, the electronic device 100 determines, at step 820, whether a second audio (e.g., music) is played back. When the electronic device 100 determines that the second audio is played back, then at step 830, the electronic device 100 outputs the first and second audio with directionality. When the electronic device 100 determines, at step 820, that a second audio isn't being played back, the electronic device 100 outputs the first audio, at step 840.

Figure 9:
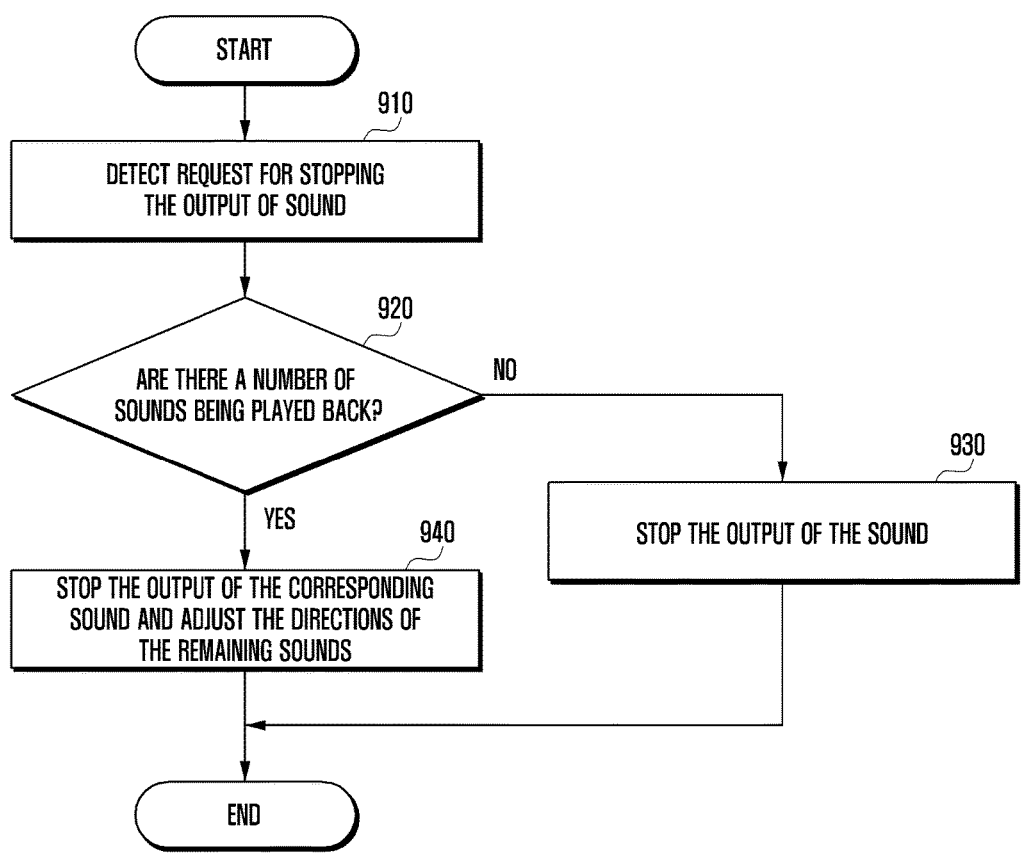
FIG. 9 is a flow chart of a method for providing audio, according to another embodiment of the present invention.

FIG. 9 is a flowchart illustrating a method for providing audio, according to another embodiment of the present invention.

Referring to FIG. 9, an electronic device 100 detects a request for stopping the output of a first audio (e.g., a user's request for terminating a call), at step 910. In response to the request for stopping the output of a first audio, the electronic device 100 determines, at step 920, whether there is other audio being played back. When the electronic device 100 determines that there isn't any other audio being played back, the first audio is stopped at step 930. When the electronic device 100 determines, at step 920, that there is other audio being played back, then at step 940, the electronic device 100 may stops the first audio and adjusts the directions of the other audio being played back. That is, the electronic device 100 may process the other audio so that they sound closer or farther away, with respect to the first audio. Alternatively, the electronic device 100 may process the other audio so that they sound as if they are from various other directions.

As described above, the audio outputting method and the electronic device, according to the embodiment of the present invention, can output more than one audio, with differing attributes simultaneously and with directionality.

As described above, the method according to the embodiment of the present invention can be implemented with programming instructions that can be conducted via various types of computers and recorded in computer-readable recording media. The computer-readable recording media contain programming instructions, data files, data structures, or a combination thereof. The programming instructions recorded in the recording media may be designed or configured to comply with the invention or may be software well-known to the ordinary person skilled in the art. Examples of computer-readable media include: magnetic media such as hard disks, floppy disks, and magnetic tape; optical media such as CD-ROM disks and DVDs; magneto-optical media such as floptical disks; and hardware devices that are specially configured to store and perform programming instructions (programming modules), such as ROM, RAM, flash memory, etc. Examples of programming instructions include machine code, such as produced by a compiler, and files containing higher level code that may be executed by the computer using an interpreter. The described hardware devices may be configured to act as one or more software modules in order to perform the operations and methods described above, or vice versa.

Although certain embodiments of the invention have been described in detail above, it should be understood that many variations and modifications of the basic inventive concept herein described, which may be apparent to those skilled in the art, will still fall within the spirit and scope of the invention as defined by the claims and their equivalents.

What is claimed is:

1. A method for providing audio in an electronic device comprising:

outputting a first audio; and when a request to output a second audio is detected, changing at least one attribute value of the first audio and the second audio and outputting the first audio and the second audio simultaneously, wherein changing the at least one attribute value of the first audio and the second audio comprises at least one of:

making the first audio and the second audio out of phase with each other;

applying a weight to a specific frequency of the first audio or the second audio; and clipping a level of sound pressure of the first audio or the second audio, wherein the method further comprises:

detecting a user input for selecting one of a first application having the first audio and a second application having the second audio; and when one of the first application or the second application is selected, performing increasing a volume of the audio corresponding to the application selected to be greater than a volume of the audio corresponding to the application not selected and clipping a level of sound pressure of the audio corresponding to the application not selected.

2. The method of claim 1, wherein outputting the first audio and second audio comprises mixing the first audio with the second audio.

3. The method of claim 1, wherein changing the at least one attribute value of the first audio and the second audio further comprises increasing a volume of the first audio to be greater than a volume of the second audio or increasing the volume of the second audio to be greater than a volume of the first audio, and wherein increasing the volume comprises increasing, when the second audio is a call audio, the volume of the second audio to be greater than the volume of the first audio.

4. The method of claim 1, further comprising:
receiving a request to stop the output of the second audio;
when the request is received, stopping the output of the second audio; and
returning, when the at least one attribute value of the first audio is changed, the attribute value of the first audio to a preset value.

5. The method of claim 1, further comprising:
displaying a first window representing the first audio and a second window representing the second audio,
wherein outputting the first audio and the second audio comprises processing the first audio and the second audio to output sound from a direction corresponding to a location of the first window and the second window displayed on a screen of the electronic device, respectively.

6. An electronic device comprising:
an input unit configured to receive user input;
an audio processing unit configured to process audio;
an audio outputting unit configured to output audio processed by the audio processing unit; and
a processor configured to control the audio processing unit, in response to the user input, to change at least one attribute value of a first audio and a second audio and output the first audio and the second audio simultaneously when a request to output the second audio is detected, and perform at least one of:
making a first audio and a second audio out of phase with each other,
applying a weight to a specific frequency of the first audio or the second audio, and
clipping a level of sound pressure of the first audio or the second audio,
wherein the electronic device further comprises a memory configured to store applications, and
wherein the processor is further configured to detect the user input for selecting one of a first application having the first audio and a second application having the second audio, and, when the first application or the second application is selected, perform increasing a volume of the audio corresponding to the application selected to be greater than a volume of the audio corresponding to the application not selected and clipping a level of sound pressure of the audio corresponding to the application not selected.

7. The electronic device of claim 6, wherein the processor is further configured to control the audio processing unit, in response to the user input, to perform increasing a volume of the first audio to be greater than a volume of the second audio or increasing the volume of the second audio to be greater than the volume of the first audio, and
wherein increasing the volume comprises increasing, when the second audio is a call audio, the volume of the second audio to be greater than the volume of the first audio.

8. The electronic device of claim 6, wherein the processor is further configured to receive a request for stopping an output of the second audio, to stop the output of the second audio, when the request is received, and to control the audio processing unit to return, when an attribute value of the first audio is changed, the attribute value of the first audio to a preset value.

9. The electronic device of claim 6, further comprising:
a display unit,
wherein the processor is further configured to control the display unit to display a first window representing the first audio and a second window representing the second audio, and
the audio processing unit is further configured to process the first audio and the second audio to output sound from a direction corresponding to a location of the first window and the second window displayed on a screen of the electronic device, respectively.

* * * * *